United States Patent [19]

Nishizawa et al.

[11] Patent Number: 5,443,033

[45] Date of Patent: Aug. 22, 1995

[54] SEMICONDUCTOR CRYSTAL GROWTH METHOD

[75] Inventors: Junichi Nishizawa, 6-16, Komegafukuro 1-chome, Sendai-shi, Miyagi-ken; Hitoshi Abe, Sendai, both of Japan

[73] Assignees: Research Development Corporation of Japan; Junichi Nishizawa; Oki Electric Industry Company Limited, all of Japan

[21] Appl. No.: 212,551

[22] Filed: Mar. 11, 1994

Related U.S. Application Data

[60] Division of Ser. No. 22,690, Mar. 1, 1993, which is a continuation of Ser. No. 794,344, Nov. 12, 1991, abandoned, which is a continuation of Ser. No. 234,001, Aug. 12, 1988, abandoned, which is a continuation of Ser. No. 759,111, Jul. 25, 1985, abandoned.

[30] Foreign Application Priority Data

Jul. 26, 1984 [JP] Japan .................. 59-153974
Jul. 26, 1984 [JP] Japan .................. 59-153975
Jul. 26, 1984 [JP] Japan .................. 59-153976

[51] Int. Cl.[6] .............................. C30B 25/14
[52] U.S. Cl. ...................... 117/86; 117/89; 117/92; 117/93; 117/108; 117/103
[58] Field of Search .............. 117/89, 92, 93, 103, 117/108, 86

[56] References Cited

U.S. PATENT DOCUMENTS

| | | |
|---|---|---|
| 2,841,477 | 7/1958 | Hall . |
| 3,901,746 | 8/1975 | Boucher . |
| 4,058,430 | 11/1977 | Suntola et al. . |
| 4,160,690 | 7/1979 | Shibagaki et al. . |
| 4,190,470 | 2/1980 | Walline . |
| 4,223,048 | 9/1980 | Engle, Jr. . |
| 4,277,304 | 7/1981 | Horiike et al. . |
| 4,368,098 | 1/1983 | Manasevit . |
| 4,413,022 | 11/1983 | Suntola et al. . |
| 4,435,445 | 3/1984 | Allred et al. . |
| 4,504,331 | 3/1985 | Kuech et al. . |
| 4,522,674 | 6/1985 | Ninomiya et al. . |
| 4,529,617 | 7/1985 | Chenevas-Paule et al. . |
| 4,540,466 | 9/1985 | Nishizawa . |
| 4,558,660 | 12/1985 | Nishizawa et al. . |
| 4,624,736 | 11/1986 | Gee et al. . |
| 4,645,687 | 2/1987 | Donnelly et al. . |
| 4,699,688 | 10/1987 | Shastry . |
| 4,806,321 | 2/1989 | Nishizawa et al. . |
| 4,834,831 | 5/1989 | Nishizawa et al. . |
| 4,975,252 | 12/1990 | Nishizawa et al. . |

FOREIGN PATENT DOCUMENTS

| | | |
|---|---|---|
| 2578680 | 9/1986 | France . |
| 3526824 | 2/1986 | Germany . |
| 148277 | 12/1978 | Japan . |
| 82732 | 5/1984 | Japan . |
| 50169 | 3/1985 | Japan . |
| 2162862 | 2/1986 | United Kingdom . |
| 2198152 | 6/1988 | United Kingdom . |

OTHER PUBLICATIONS

M. Pessa et al., "Characterization of surface exchange reactions used to grow compound films", Appl. Phys. Lett. 38(3), Feb. 1, 1981, pp. 131–132.

M. Pessa et al., "Atomic Layer epitaxy and characterization of CdTe films grown on CdTe (110) substrates", J. Appl. Phys. 54(10), Oct. 1983, pp. 6047–6050.

(List continued on next page.)

*Primary Examiner*—Robert Kunemund
*Attorney, Agent, or Firm*—Armstrong, Westerman, Hattori, McLeland & Naughton

[57] ABSTRACT

A substrate is heated in a crystal growth vessel evacuated to a ultrahigh vacuum, and gases containing component elements of a crystal to be grown on the substrate are introduced into the vessel under predetermined conditions to cause successive epitaxial growth of single molecular layers, the number of growth cycles being automatically controlled. A mass analyzer is disposed opposite to the substrate in the vessel so that the progress of crystal growth can be incessantly traced and evaluated for each of the molecular layers. An etchant gas introduction nozzle extends into the vessel to make etching treatment of the surface of the substrate in the evacuated vessel prior to the crystal growth.

7 Claims, 10 Drawing Sheets

OTHER PUBLICATIONS

M. Pessa et al., "Atomic Layer Epitaxy of CdTe on the Polar (111)A and (111)B Surfaces of CdTe Substrates", Journal of Crystal Growth 67 (1984), pp. 255–260.

M. Ahonen et al., "A Study of ZnTe Films Growth on Glass Substrates Using an Atomiclayer Evaporation Method", Thin Solid Films, 65 (1980) 301–307.

Jun–ichi Nishizawa, "Doping in Molecular Layer Epitaxy", Reprinted from Journal of the Electrochemical Society, vol. 136, No. 2, Feb. 1989, pp. 478–484.

S. M. Bedair et al., "Atomic layer epitaxy of III–V binary compounds", Appl. Phys. Lett., vol. 47, No. 1, Jul. 1, 1985, pp. 51–53.

Lewis M. Fraas, "A new low temperature III–V multilayer growth technique: Vacuum metalorganic chemical vapor deposition", J. Appl. Phys. 52(11), Nov. 1981, pp. 6939–6943.

Theodore L. Brown, General Chemistry, §17–2, "The Effect of External Variables on the Value of the Equilibrium Constant", pp. 278–282, 1963.

G. M. Guro et al., "Activation of the Growth of Epitaxial Layers of Narrow–Band Semiconductors by Light Radiation", Sov. Phys.—Lebedev Inst. Rep. (USA), 1978, pp. 22–26.

P. Daniel Dapkus, "Metalorganic Chemical Vapor Deposition", Ann Rev Mater Sci, 1982, pp. 243 & 259.

Jun–ichi Nishizawa et al., "Molecular Layer Epitaxy in Gallium Arsenide", Acta Polytechnica Scandinavia, Chemical Technology and Metallurgy Series No. 195, UDC 539.23:541.17:621.315.59, 1st International Symposium of Atomic Layer Epitaxy, 1990, pp. 1–15.

John F. O'Hanlon, "A User's Guide to Vacuum Technology" in Japanese, Jul. 30, 1958, pp. 65–91.

Irving Langmuir, "The Constitution and Fundamental Properties of Solids and Liquids", The Journal of the American Chemical Society, vol. XXXVIII, Jul.–Dec. 1916, pp. 2221–2295.

Irving Langmuir, "The Adsorption of Gases on Plane Surfaces of Glass, Mica and Platinum", The Journal of the American Chemical Society, vol. XL, Jul.–Dec. 1918, pp. 1361–1403.

James W. McBain et al., "The Nature of the Sorption by Charcoal of Gases and Vapors Under Great Pressure", The Journal of the American Chemical Society, vol. 52, No. 5, May 1930, pp. 2198–2222.

Stephen Brunauer et al., "The Use of Low Temperature van der Waals Adsorption Isotherms in Determining the Surface Areas of Various Adsorbents", The Journal of the American Chemical Society, vol. LIX, 1937, pp. 2682–2689.

Jun–ichi Nishizawa et al., "Silicon Molecular Layer Epitaxy", J. Electrochem. Soc., vol. 137, No. 6, Jun. 1990, pp. 1898–1904.

Jun–ichi Nishizawa et al., "Molecular Layer Epitaxy of Silicon", Journal of Crystal Growth 99 (1990) pp. 502–505.

Kenji Aoki et al., "Silicon Molecular Layer Epitaxy", Denshi Tokyo No. 30 (1991), pp. 33–37.

Jun–ichi Nishizawa et al., "Surface reaction mechanism in Si and GaAs crystal growth", Surface Science Reports, review journal, vol. 15, Nos. 4/5, 1992, pp. 137–204.

Tohru Kurabayashi et al., "Photoexcited Molecular Layer Epitaxial Growth Process of GaAs, GaAlAs, and Si; and Photo–Vapor Phase Epitaxy of GaAs", Project for Promoting the Development of Creative Science & Technology, Research Development Corporation of Japan, Nishizawa Project on Perfect Crystals, Dec. 19, 1986, pp. 2–7.

Tohru Kurabayashi et al., "Photoexcited Molecular Layer Epitaxial Growth Process of GaAs, GaAs and Si, and Photo–Vapor–Epitaxy of GaAs", Collected Summaries of Researches (published for Research Development Corporation of Japan), Dec. 19, 1986, cover page and pp. 1–24 all in Japanese (An English translation of the pertinent pp. 13–14 is attached.)

Junichi Nishizawa et al., "Molecular Layer Epitaxy", Semiconductor Research, vol. 29 (published for Industrial Survey under the Foundation for Promoting Semiconductor Research), Aug. 22, 1987, cover page and pp. 97–136 all in Japanese (An English translation of the pertinent pp. 98 to 103 is attached.)

Tohru Kurabayashi, "Photo–Assisted Molecular Layer Epitaxy", Semiconductor Research, vol. 33 (published for Industrial Survey under the Foundation for Promoting Semiconductor Research, Aug. 8, 1989, cover page and 33 pages all in Japanese (An English translation of the pertinent pp. 4–6 is attached.)

Junichi Nishizawa, "Crystal Growth by Atomic Layer Epitaxy", Applied Physics, vol. 53, No. 6 (1984), cover page, page of Table of Contents, and pp. 516 (54)–520 (58) in Japanese (An English translation of the pertinent pp. 516–519 is attached.)

SEMICONDUCTOR CRYSTAL GROWTH METHOD

This is a division of application Ser. No. 08/022,690, filed Mar. 1, 1993, which is a continuation application of Ser. No. 07/794,344, filed Nov. 12, 1991, now abandoned, which is in turn a continuation application of Ser. No. 07/234,001, filed Aug. 12, 1988, now abandoned, and which is in turn a continuation application of Ser. No. 06/759,111, filed Jul. 25, 1985, now abandoned.

BACKGROUND OF THE INVENTION

1. Field of the invention

The invention relates to a semiconductor crystal growth apparatus suited for forming monocrystalline growth layers of a semiconductor with precision as precise as a single molecular layer.

2. Description of the Prior Art

A Metal Organic Vapour Phase epitaxy process (hereinafter referred to as an MO-CVD process), a molecular beam epitaxial process (hereinafter referred to as an MBE process) and an atomic layer epitaxial process (hereinafter referred to as an ALE process) are well known in the art as vapor phase epitaxial techniques for obtaining crystalline thin film of semiconductors.

In the MO-CVD process, III and V group elements as sources, and hydrogen gas or the like as a carrier are simultaneously introduced into a reaction chamber to cause crystal growth by means of thermal decomposition. The thermal decomposition results in a poor quality of the grown crystal layer. In addition, the thickness control which is dimensionally as precise as a single monolayer is difficult.

The MBE process is well known as a crystal growth process making use of a ultrahigh vacuum, This process, however, includes a first stage of physical adsorption. Therefore, the quality of the crystal obtained is inferior to that obtained by the CVD process which makes use of a chemical reaction. Besides, for the growth of a compound semiconductor such as GaAs of III and V group elements, III and V group elements are used as sources and are disposed in a growth chamber. Therefore, it is difficult to control the amount and rate of vaporization of gases evaporated as a result of the heating of the sources. In addition, replenishment of the sources is difficult. Further, it is difficult to maintain a constant growth rate for a long period of time. Furthermore, the evacuating device is complicated in construction. Still further, precise control of the stoichiometric composition of a compound semiconductor is difficult. Consequently, the MBE process is defective in that high quality crystals cannot be obtained.

The ALE process is an improvement over the MBE process. In this process, component elements of a compound semiconductor are alternately supplied in the form of pulses so that monoatomic layers are alternately deposited on a substrate to cause growth of a thin film composed of atomic layers, as disclosed in U.S. Pat. No. 4,058,430 (1977) to T. Suntola et al. Although this process is advantageous in that the film thickness can be controlled with the precision of the atomic layer, it is actually an extension of the MBE process, and the crystal quality is not satisfactory as in the case of the MBE process. Besides, its application is limited to growth of thin films of compound semiconductors, e.g., those of II and IV group elements, such as CdTe and ZnTe, and the process is not successfully applicable to Si or GaAs, which is the most important semiconductor material presently used for the production of semiconductor devices including ultra LSI's. There are attempts for improving the ALE process so as to absorb molecules to the surface of a crystal thereby to make use of chemical reactions on the surface of the crystal. This approach, however, concerns only with the growth of polycrystals of ZnS or amorphous thin films of $Ta_2O_5$, and has not concern with a single crystal growth technique.

With any of the prior art crystal growth processes described above, it has been difficult to obtain a crystal film of high quality and it has not been easy to control the thickness of the crystal film to a desired value.

In the meantime, in the manufacture of a semiconductor device, it is important to make evaluation during the manufacturing process as to whether or not a crystal is growing as designed for obtaining a high-quality semiconductor device. In the prior art, the evaluation has been done by taking out the semiconductor from the growth vessel and testing it using an analyzer. The operation of evaluation, therefore, has been very cumbersome, and the evaluation efficiency has not been high, resulting in incapability of attaining satisfactory quality control. Further, when a new device is to be manufactured, the evaluation has required a long time resulting in a great delay of the manufacture.

From the aspect of growth of a thin crystal film on a substrate, the surface state thereof is very important. If the surface state is unsatisfactory, the grown crystal will also have an unsatisfactory crystal property, and, in worst cases, no crystal growth is attained at all. In the case of a GaAs substrate, for instance, it has to be pretreated, prior to the crystal growth, by means of wet etching using a liquid etchant mixture consisting of $H_2SO_4$, $H_2O_2$ and $H_2O$. However, since the surface after etching is very active, an oxide layer or like deposit layer has been formed thereon, if it were exposed to atmosphere after the step of etching.

SUMMARY OF THE INVENTION

An object of the invention is to provide a semiconductor crystal growth apparatus, which can obviate the prior art drawbacks noted above and can automatically form high-quality single crystal layers with precision as precise as a single molecular layer.

According to one aspect of the invention which attains the above object, there is provided a semiconductor crystal growth apparatus, which comprises a crystal growth vessel for accommodating a substrate, heating means for heating the accommodated substrate, evacuating means for evacuating the crystal growth vessel to a ultrahigh vacuum, nozzle means for introducing gases containing component elements of a crystal to be grown on the substrate into the crystal growth vessel from outside, valve means provided between the nozzle means and sources of the gases, and control means for controlling the opening and closing of the valve means according to a preset open-close time chart and a preset number of cycles of valve opening and closing.

The apparatus having such a construction can ready cause successive growth of molecular layers which satisfy the desired stoichiometrical composition, so that a high-quality crystal can be obtained. In addition, since impurities can be doped in the desired layers, it is possible to obtain a very sharp impurity concentration distribution. Further, an epitaxial growth layer having a desired thickness can be obtained automatically with precision as precise as a single molecular layer.

Another object of the invention is to provide a semiconductor crystal growth apparatus, which can manufacture a semiconductor with high efficiency by successively tracing and evaluating the progress of semiconductor crystal growth.

According to another aspect of the invention which attains this object, there is provided a semiconductor crystal growth apparatus, which comprises a crystal growth vessel for accommodating a substrate, heating means for heating the accommodated substrate, evacuating means for evacuating the crystal growth vessel to a ultrahigh vacuum, nozzle means for introducing gases containing component elements of a crystal to be grown on the substrate into the crystal growth vessel from outside, and a mass analyzer disposed opposite to the accommodated substrate.

With this apparatus having the mass analyzer provided in the crystal growth vessel, the progress of semiconductor crystal growth can be instantaneously evaluated, so that it is possible to manufacture a semiconductor device with high efficiency.

A further object of the invention is to provide a semiconductor crystal growth apparatus, which can cause growth of a high-quality monocrystalline film on a substrate with dimensional precision as precise as a single molecular layer, by etching the substrate surface in a vacuum prior to the crystal growth.

In accordance with another aspect of the invention which attains this object, there is provided a semiconductor crystal growth apparatus, which comprises a crystal growth vessel for accommodating a substrate, heating means for heating the accommodated substrate, evacuating means for evacuating the crystal growth vessel to a ultrahigh vacuum, nozzle means for introducing gases containing component elements of a crystal to be grown on the substrate, and another nozzle means for introducing an etchant gas.

With this apparatus, the etching process which is a pretreatment prior to the epitaxial growth can also be executed in the same crystal growth vessel. The substrate surface can thus be pretreated to a state satisfactory for the crystal growth. That is, growth of a satisfactory single crystal which satisfies the desired stoichiometrical composition can be reliably attained. It is thus possible to obtain a semiconductor device having very satisfactory characteristics.

Other objects and features of the invention will become more apparent from the following detailed description.

DESCRIPTION OF THE PREFERRED EMBODIMENT

Figure 1:
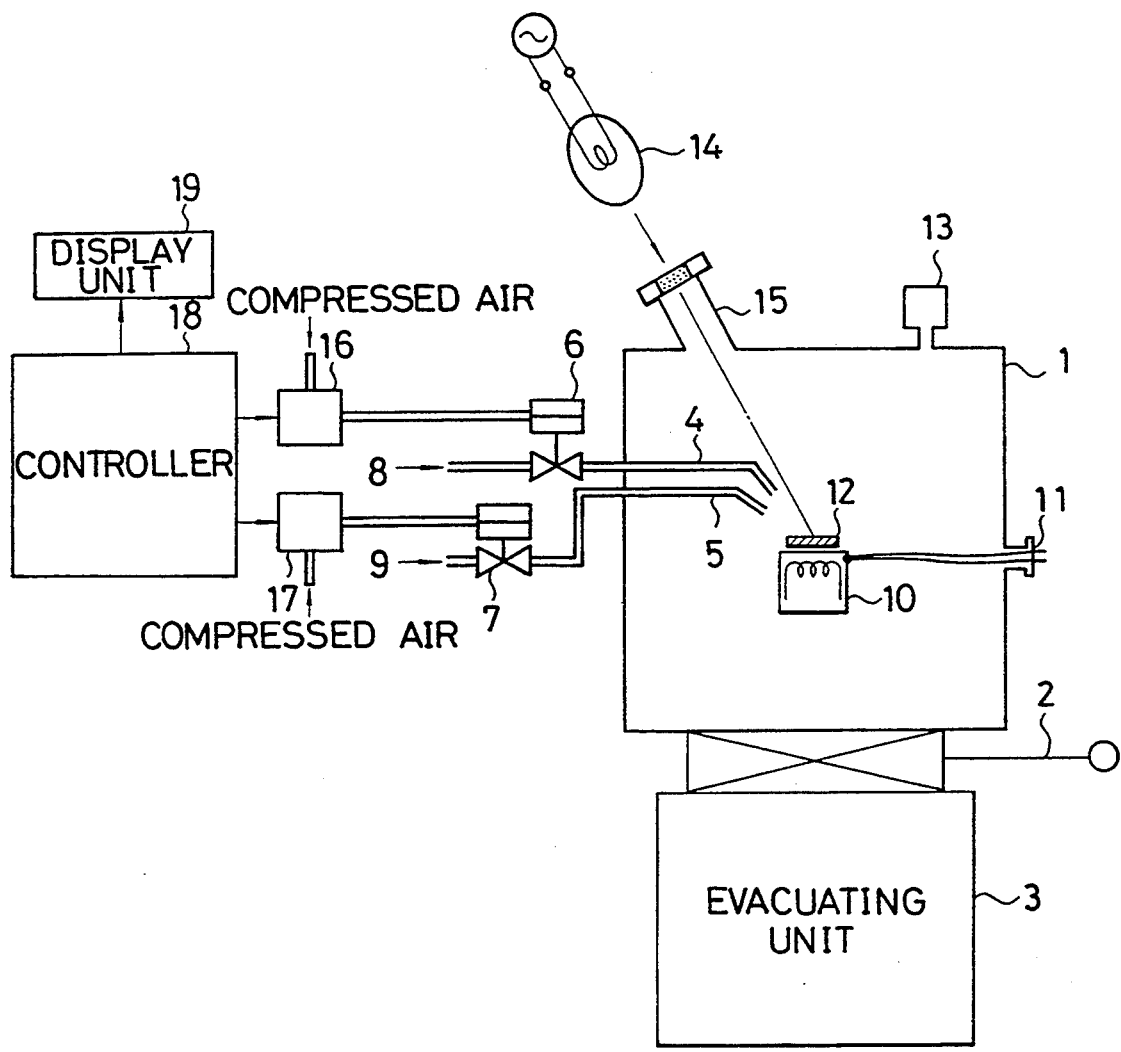
FIG. 1 is a schematic view showing an embodiment of the semiconductor crystal growth apparatus according to the invention.

Referring now to FIG. 1, a crystal growth vessel 1 is made of stainless steel or like metal. The vessel 1 is coupled to an evacuating unit 3 via a gate valve 2 for evacuating its interior to a ultrahigh vacuum. The vessel 1 includes nozzles 4 and 5 for introducing gaseous compounds containing III and V group elements respectively as components of a III–V group compound semiconductor which should grow on a substrate 12. The nozzles 4 and 5 are provided with on-off valves 6 and 7 for controlling the introduced amounts of the gaseous compounds 8 and 9 containing the III and V group elements, respectively. A heater 10 for heating the substrate 12 is disposed in the vessel 1, and a thermocouple 11 is coupled to the heater 10 for measuring the temperature thereof of the substrate 12. The heater 10 includes a tungsten filament sealed in a quartz glass casing on which the substrate 12 of a compound semiconductor is mounted. The vessel 1 is further provided with a pressure gauge 13 for measuring the value of its internal vacuum. The vessel 1 is further provided with an optical window 15, through which radiation having a specific wavelength emitted from a radiation source 14 is focused on the substrate 12. Electromagnetic valves 16 and 17 are provided for controlling the flow of compressed air which is used to open and close the valves 6 and 7. The electromagnetic valves 16 and 17 are on-off controlled by a control unit 18 utilizing a microcomputer. A display unit 19 is provided to display the number of cycles of opening and closing the valves 6 and 7.

A monocrystalline thin film of a compound semiconductor is formed in a manner as described below by the crystal growth apparatus of the above structure. Suppose, for example, the case of epitaxial growth of a single crystal of GaAs on the GaAs substrate 12. First, the vessel 1 is evacuated to about $10^{-7}$ to $10^{-8}$ Pascal (hereinafter abbreviated as Pa) by opening the gate valve 2 and operating the ultrahigh-vacuum evacuating unit 3. Then, the GaAs substrate 12 is heated to 300° to 800° C. by the heater 10. Thereafter, gaseous trimethyl gallium (TMG) 8 is introduced as Ga-containing gas by holding the valve 6 open for 0.5 to 10 sec. and maintaining the internal pressure of the vessel 1 at $10^{-1}$ to $10^{-7}$ Pa. Then, the valve 6 is closed, and the vessel 1 is evacuated again. Thereafter, gaseous arsine ($ASH_3$) 9 is introduced as a gas containing As by holding the valve 7 open for 2 to 200 sec. and maintaining the internal pressure of the vessel at $10^{-1}$ to $10^{-7}$ Pa. As a result, at least one molecular layer of GaAs grows on the substrate 12.

In this case, when the substrate 12 is irradiated with ultraviolet rays emitted from the radiation source 14 while it is heated, the growth temperature can be reduced to be 400° C. or below, and the crystal quality can be improved.

It is possible to successively form molecular layers of GaAs having the same thickness by executing the epitaxial growth by setting the internal pressure of the growth vessel 1, the temperature of the substrate 12, the intensity of radiation from the radiation source 4 and the on-off durations of the valves 6 and 7 at predetermined values, respectively. Thus, growth of an epitaxial growth layer of GaAs having a desired thickness can be attained with precision as precise as a single molecular layer by repeating the molecular-layer growth cycle a predetermined number of times.

Figure 2:
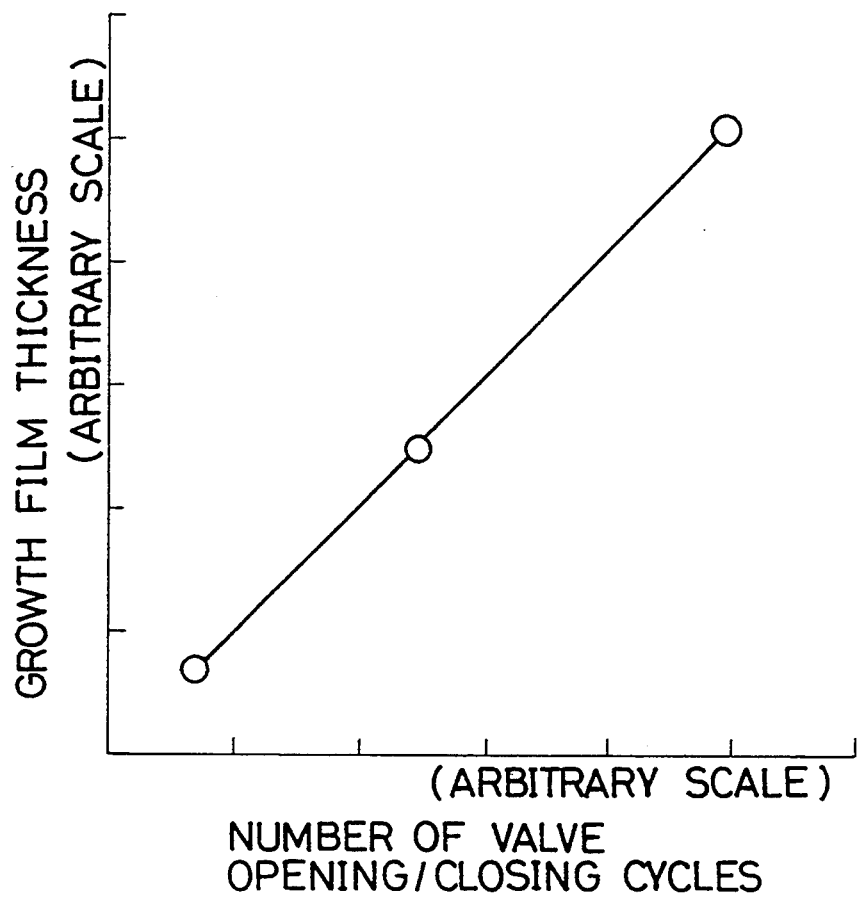
FIG. 2 is a graph showing a relation between the thickness of the growth film and the number of times of valve opening and closing in the apparatus shown in FIG. 1.

FIG. 2 shows the experimentally observed relation between the thickness of the GaAs epitaxial layer and the number of cycles of alternately introducing gaseous TMG and AsH$_3$ at a growth temperature of 500° C. For example, epitaxial layers having film thicknesses of 1,100 Å, 0.57 µm and 1.13 µm grew as a result of 400, 2000 and 4000 cycles of alternate introduction of the gases 8 and 9, respectively. It should be noted that the relation between the thickness of the growth film and the number of cycles of gas introduction, i.e., the number of cycles of opening and closing the valves, is very linear. It is thus confirmed that the film thickness of the growth layer can be controlled by controlling the number of cycles of opening and closing the valves.

The electromagnetic valves 16 and 17 and control unit 18 are provided for controlling the film thickness of the growth layer by controlling the number of cycles of opening and closing the valves. Data indicative of the number of cycles of opening and closing the valves 6 and 7, the period $\tau_1$ of introduction of the gas 8, the period $\tau_2$ of exhausting the gas 8, the period $\tau_3$ of introduction of the gas 9 and the period $\tau_4$ of exhausting the gas 9, are preset in the control unit 18 in correspondence to the thickness of the growth layer to be obtained.

The control unit 18 includes a clock pulse generator, various counters and registers. When the operation of the control unit 18 is started, it controls the opening and closing of the valves 6 and 7 with timing as shown in FIG. 4 by running a routine as shown in FIG. 3.

Figure 3:
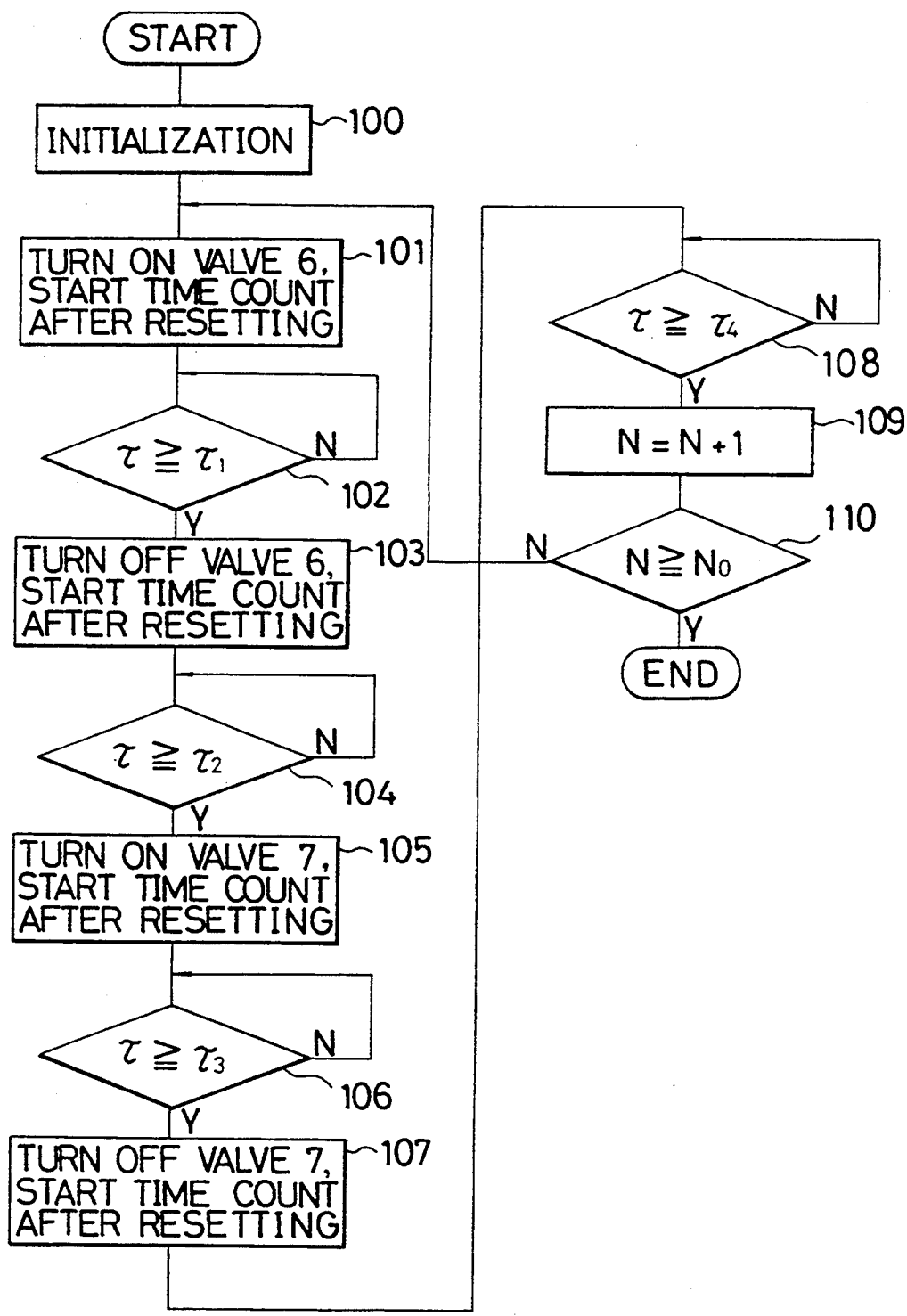
FIG. 3 is a flow chart illustrating the operation of the control unit shown in FIG. 1.
Figure 4:
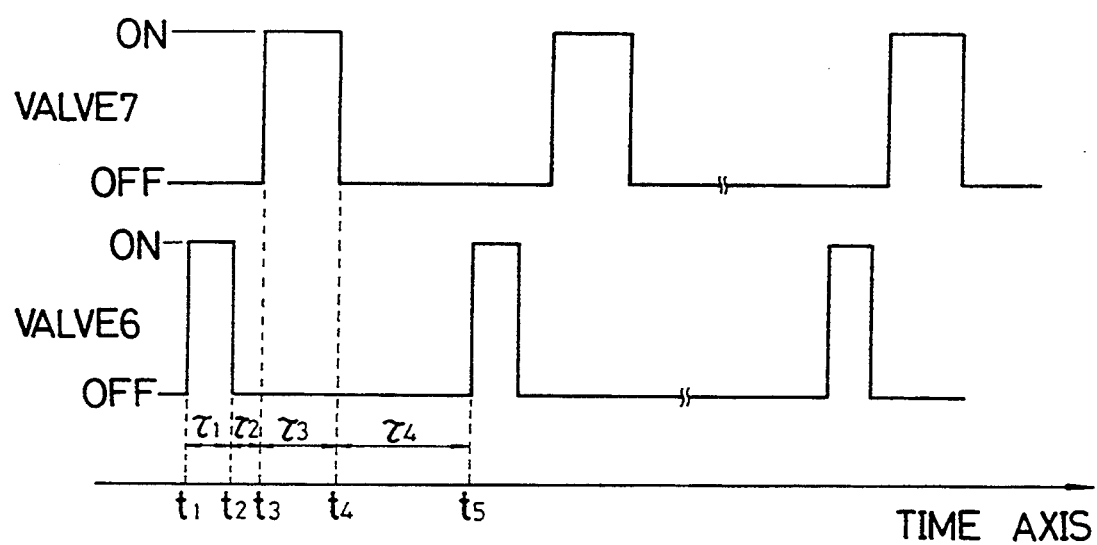
FIG. 4 is a time chart showing the timing of gas introduction in the apparatus shown in FIG. 1.

Referring to FIG. 3, the control unit 8 first initializes the various internal counters and registers (step 100). Then, it applies an "on" signal to the electromagnetic valve 16 to turn on (i.e., open) the valve 6 at time $t_1$. The control unit 18 resets a time counter ($\tau$) and then re-starts the time counting operation of the time counter (step 101). The gas 8 is thus introduced for crystal growth on the substrate 12. When the control unit 18 detects that the count $\tau$ of the time counter, i.e., the gas introduction period, attains $\tau_1$ (step 102), it turns off the valve 6 at time $t_2$, thereby exhausting the introduced gas 8. The control unit 18 resets the time counter ($\tau$) once and re-starts the time counting operation of the time counter (step 103). After the preset exhausting period $\tau_2$ has elapsed (step 104), the control unit 18 turns on the valve 7 at time $t_3$, and re-starts the time counter in the manner as described (step 105). At this time the gas 9 is now introduced for crystal growth on the substrate 12. When the gas introduction period $\tau$ attains $\tau_3$ (step 106), the control unit 18 turns off the valve 7 at time $t_4$, thereby exhausting the gas from the vessel 1 and re-starts the time counter (step 107). After the preset exhausting period $\tau_4$ has elapsed (step 108), the count N of a valve on-off cycle counter is incremented to N+1. By the above sequence of operations of the control unit 18, one molecular layer of GaAs is formed on the substrate 12 as mentioned earlier. The control unit 18 subsequently checks as to whether or not the count N has attained the preset number No (step 110). If the preset number No has not yet been reached, the control unit 18 repeats the sequence of operations to form a second molecular layer of GaAs. When the predetermined successive molecular layers of GaAs are formed on the substrate 12, the growth operation is ended. In this way, the film of GaAs having the desired thickness grows automatically on the substrate 12 with the precision as precise as a single molecular layer. While the control unit 18 is performing the sequence of control operations noted above, the number N of executed valve on-off cycles is displayed on the display unit 19. The operator participating in the manufacture of the semiconductor thus can grasp the progress of the crystal growth.

The Ga-containing material gas may be gaseous TMG, ZEGaCl, GaBr$_3$, GaI$_3$ or GaCl$_3$. The irradiation with the ultraviolet radiation may be done continuously or intermittently during the process of growth. The radiation source may be a lamp such as a high-pressure mercury lamp or a xenon lamp or a laser as an excimer laser.

While the above embodiment has referred to GaAs as a semiconductor to be grown as a crystal, the invention is of course applicable to other III–V group compounds and II–VI group compounds such as InP, AlP, GaP, etc. Further, it is possible to grow mixture crystals such as Ga$_{(1-x)}$Al$_x$As and Ga$_{(1-x)}$Al$_x$As$_{(1-y)}$P$_y$. Further, the substrate is not limited to GaAs, but it is possible to cause heteroepitaxial growth on substrates of other compounds. Further, the semiconductor may be an element semiconductor belong to, for example, the IV group. Where the element semiconductor is Si, the crystal growth may be caused by using a combination of such a chloride as SiCl$_4$, SiHCl$_3$ and SiH$_2$Cl$_2$ and H$_2$ gas.

Further, while, in the above embodiment, the heat source for heating the substrate 12 has been provided inside the growth vessel 1, it is also possible to dispose an infrared lamp or like heat source outside the growth vessel 1 so that the substrate 12 may be heated by heat rays transmitted through an optical window provided on the vessel 1 to irradiate the substrate 12.

Figure 5:
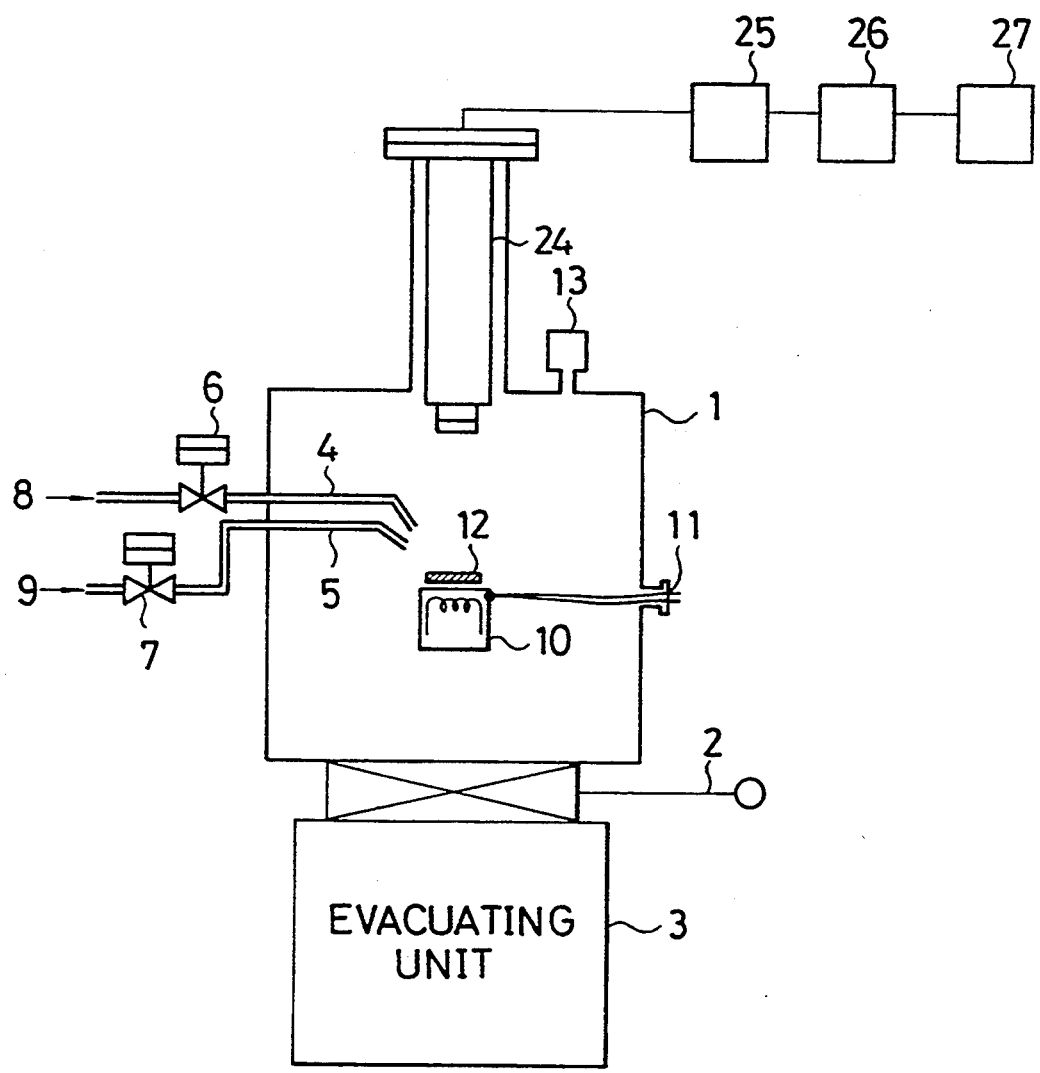
FIG. 5 is a schematic view showing another embodiment of the semiconductor crystal growth apparatus according to the invention.

FIG. 5 shows another embodiment of the semiconductor crystal growth apparatus according to the invention. In the FIG. 5, the same reference numerals are used to designate the same or equivalent parts appearing in FIG. 1. This apparatus is greatly different from the structure shown in FIG. 1 in that a mass analyzer 24, a mass analyzer controller 25, a multiple ion sensor 26 capable of simultaneously sensing a plurality of different kinds of molecules, and a multiple pen recorder 27 for recording the output of the multiple ion sensor 26, these components constituting evaluating means. The other structure of the apparatus except that concerning the evaluating means is the same as that in the preceding embodiment shown in FIG. 1, so it will not be described any further.

With this apparatus, epitaxial growth of molecular layers is attained while tracing and evaluating the progress of crystal growth by the evaluating means 24 through 27 as follows. Suppose, for example, that GaAs is a semiconductor whose crystal grows on the substrate 12; gaseous trimethyl gallium (TMG), which is a III group compound, is the gas 8 to be introduced; and gaseous arsine (ASH$_3$), which is a V group compound, is the gas 9.

First, the substrate 12 is set in the growth vessel 1, and the vessel 1 is evacuated by the evacuating unit 3 to about $10^{-7}$ to $10^{-8}$ Pascal (hereinafter referred to as Pa). Then, the operation of the evaluating means 24 through 27 is started. The peak selector of the multiple ion sensor 26 is set to select the introduced gas molecules of AsH$_3$ (M/e=78), and TMG (M/e=114) and to select the reaction product molecules of, for example, CH$_4$ (M/e=16). Then, the GaAs substrate 12 is heated to 300° to 800° C., for instance, by the heater 10. Gaseous TMG 8 is then introduced as Ga-containing gas by holding the valve 6 open for 0.5 to 10 seconds and maintaining the internal pressure of the growth vessel 1 at $10^{-1}$ to $10^{-7}$ Pa. Subsequently, the valve 6 is closed, and the gas in the vessel 1 is exhausted. Now, gaseous AsH$_3$ 9 is introduced as As-containing gas by holding the valve 7 open for 2 to 200 seconds and maintaining the internal pressure of the vessel 1 at $10^{-1}$ to $10^{-7}$ Pa. In this way, at least one molecular layer of GaAs grows on the substrate 12. It is to be noted that a single crystal growth layer of GaAs having a desired thickness grows with precision as precise as a single molecular layer by repeating the sequence of operations described above.

In the above crystal growth process, by alternately introducing gaseous TMG and ASH$_3$, not only TMG and AsH$_3$ but also methane (CH$_4$) which is a reaction product can be detected, and the progress of the crystal growth can be successively traced by the multiple ion sensor 26.

Figure 6:
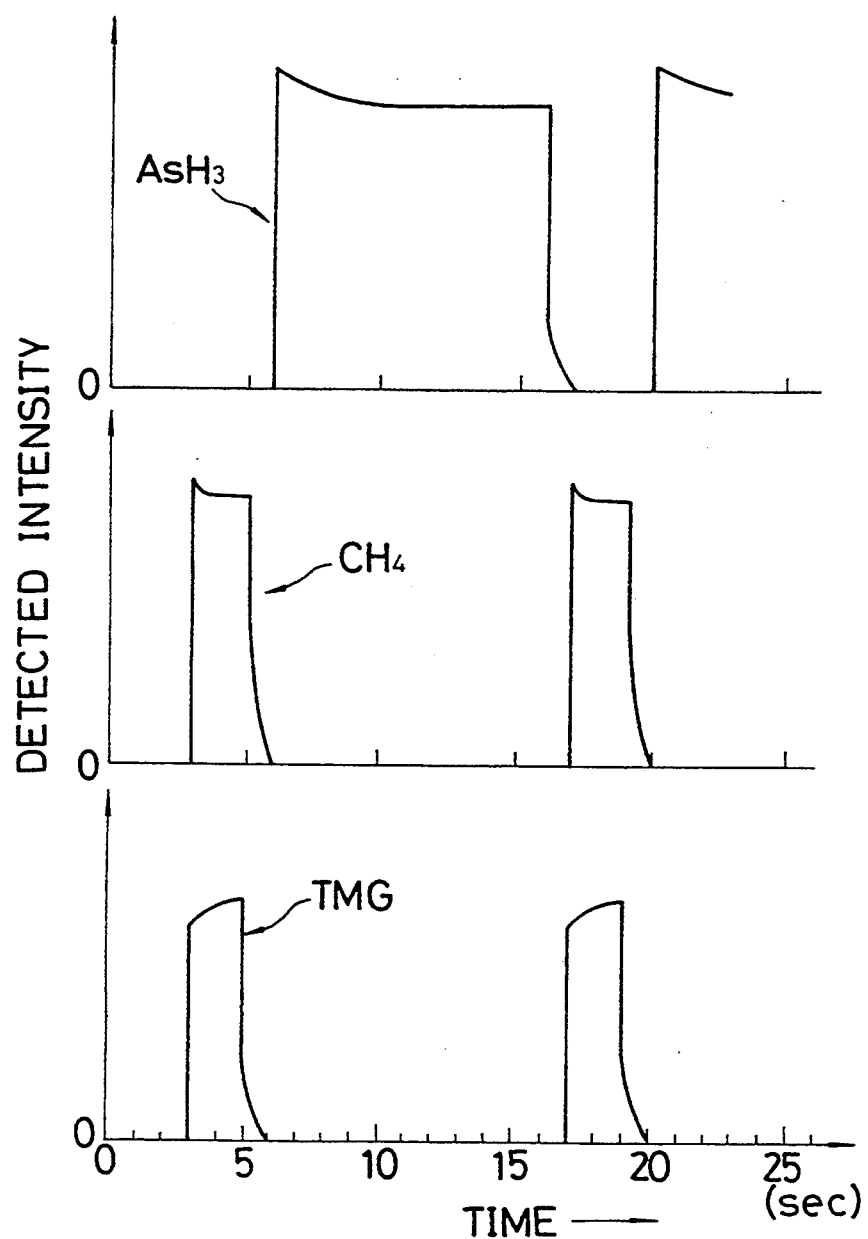
FIG. 6 is a waveform diagram showing levels of compounds detected by the mass analyzer shown in FIG. 5.

FIG. 6 shows the relative intensities of AsH$_3$ (M/e=78), TMG (M/e=114) and CH$_4$ (M/e=16) detected by the multiple ion sensor 26 when TMG and AsH$_3$ are alternately introduced in the manner as described above. More specifically, the graph shows the data obtained when the step of introducing TMG under a pressure of $10^{-13}$ Pa by holding the valve 6 open for 2 seconds and the step of introducing AsH$_3$ under a pressure of $10^{-2}$ Pa by holding the valve 7 open for 10 seconds are alternately repeated.

Where TMG or GaCl$_3$ is used as the Ga-containing compound, the introduced gas will attach to the wall of the growth vessel as well as to the substrate because of great interaction of the gas with the vessel wall due to its low vapor pressure at room temperature. Further, the attaching compound is liberated with the lapse of time, and the liberated gas cannot be distinguished from the gas liberated from the substrate.

Figure 7:
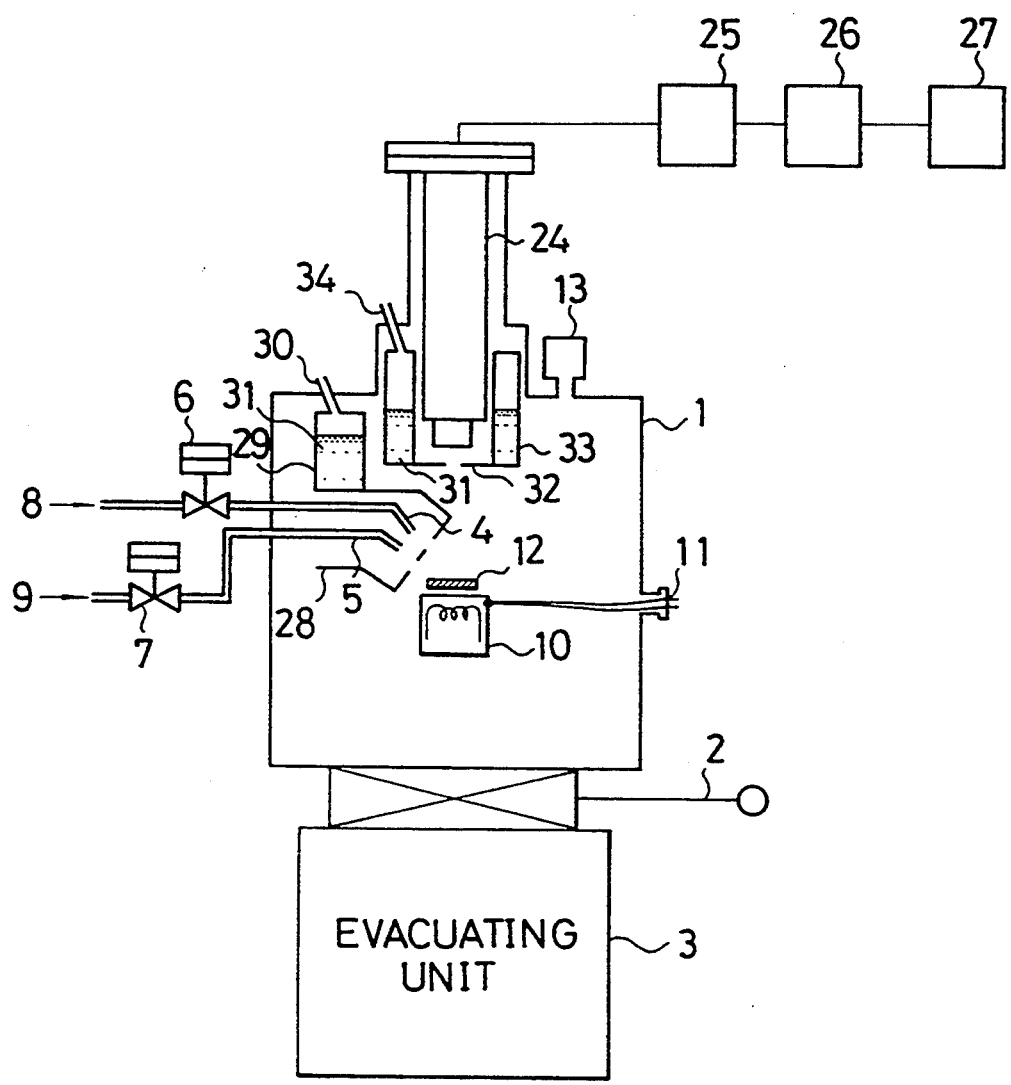
FIG. 7 is a schematic view showing a further embodiment of the semiconductor crystal growth apparatus according to the invention.

FIG. 7 shows a further embodiment or a modification, which can solve the above problem. In this apparatus, a shroud 28 is provided in such a position as to surround the nozzles 4 and 5. The shroud 28 has holes or openings aligned with the respective nozzles. To cool the shroud 28, a coolant reservoir 29 is provided at an end of the shroud, and a coolant 31 is poured into the reservoir 29 through an inlet 30 thereof. Likewise, another shroud 32 is provided, which has a detection opening which is aligned with the end of mass analyzer 24, and another coolant reservoir 33 is provided at an end of the shroud 32 to cool the same with a coolant 31 poured into the reservoir 33 through an inlet 34. Means for cooling the shrouds is not limited to a coolant such as liquefied nitrogen, and a miniature freezer can also be utilized.

With this arrangement, an excess of the gas introduced into the growth vessel 1 is adsorbed by the shrouds 28 and 32, and only molecules that are liberated from the substrate 12 are captured by the mass analyzer 24. Thus, it is possible to attain accurate analysis of the growth layer.

A high-quality semiconductor device can be manufactured efficiently by incessantly tracing and evaluating the progress of growth of one molecular layer after another of a semiconductor crystal on the substrate 12, by the mass analyzer mounted to the growth vessel 1.

It is needless to mention that the material of the substrate 12 and the semiconductor formed thereon is not limited to GaAs. In addition, it is possible to introduce more than two different kinds of gases into the growth vessel 1, by increasing the number of nozzles for doping with impurities or obtaining mixed crystals.

In the above embodiments, the heat source for heating the substrate 12 is disposed in the growth vessel 1, but it is also possible to provide an infrared lamp or the like disposed outside the growth vessel 1. Further, the substrate 12 may be irradiated with light while it is heated. By so doing, it is possible to reduce the substrate temperature and further improve the quality.

Figure 8:
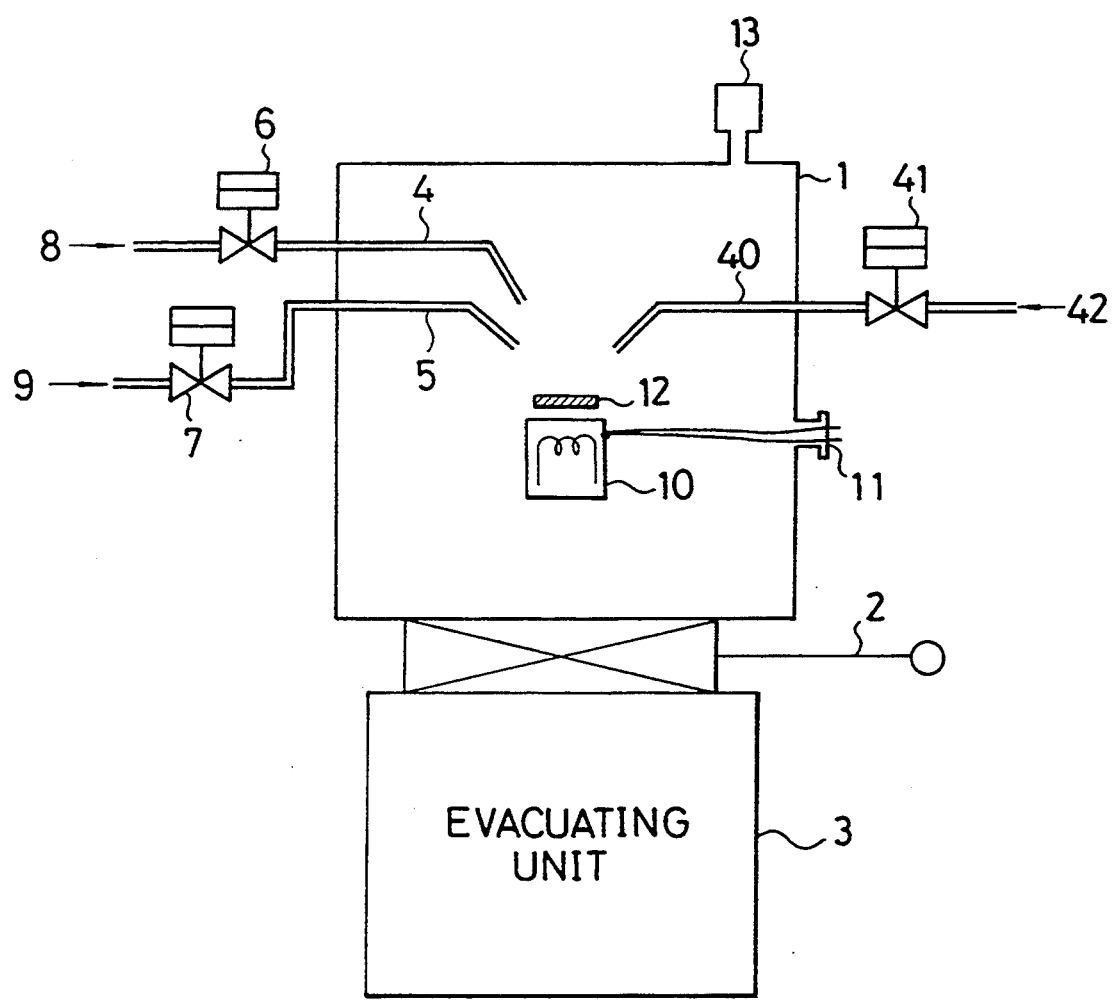
FIG. 8 is a schematic view showing a still further embodiment of the semiconductor crystal growth apparatus according to the invention.

FIG. 8 shows a further embodiment of the semiconductor crystal growth apparatus according to the invention. This apparatus is provided with a mechanism which permits vapor phase etching as means for treating the substrate surface. In FIG. 8, the same reference numerals are used to designate the same or equivalent parts appearing in FIG. 1. This apparatus is different from the apparatus shown in FIG. 1 in that it does not have the radiation source 14 and optical window 15 for irradiate the substrate 12 with radiation from outside the growth vessel 1 and, in lieu thereof, it is provided with a nozzle 40 for introducing a gaseous compound 42 used for the vapor phase etching and a valve 41 for opening and closing the nozzle 40 introducing the gaseous compound 42 used for the vapor phase etching. The other parts except those provided for introducing the etching gas are the same as those described before in connection with FIG. 1, so they will not be described any further.

In this apparatus, the vapor phase etching is carried out as follows. Suppose, for example, the case, in which a GaAs substrate is used as the compound semiconductor substrate and GaCl$_3$ is used as the gaseous compound introduced for etching purpose. First, the GaAs substrate 12 is etched in the usual way, then rinsed and dried, and then set on the heater 10. Subsequently, the growth vessel 1 is exhausted to approximately $10^{-7}$ Pa by the exhausting unit 3. Then, gaseous GaCl$_3$ is introduced to provide an internal pressure of about $10^{-6}$ to $10^{-5}$ Pa by opening the valve 41. The GaAs substrate could be etched at a rate of about 1 to 1,000 Å/min by varying the substrate temperature.

Figure 9:
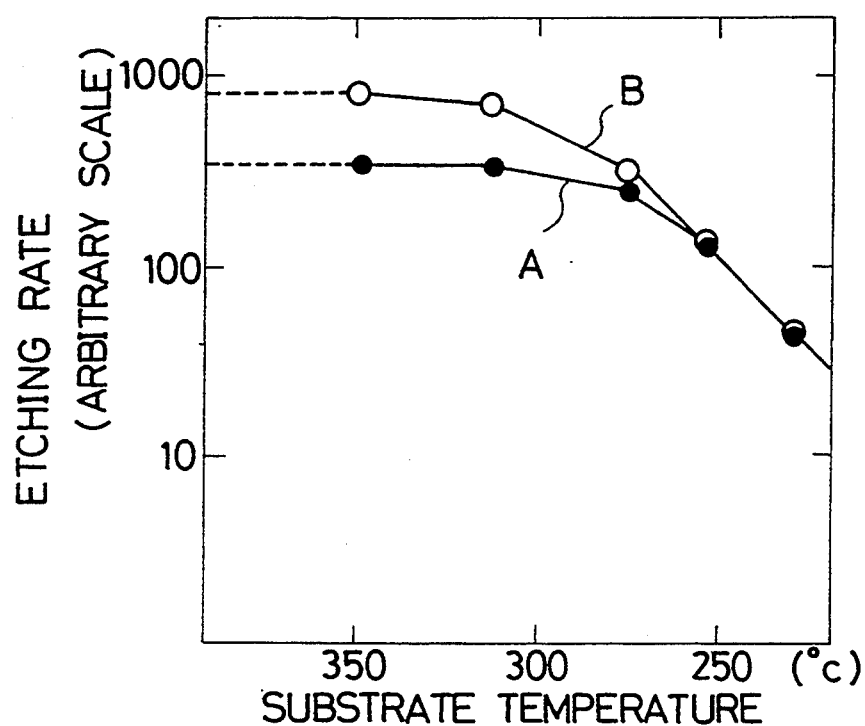
FIG. 9A is a graph showing the relation between the rate of etching of the GaAs substrate with $GaCl_3$ and the substrate temperature.
FIG. 9B is a graph showing the relation between the etching rate and the $GaCl_3$ supply rate.
Figure 9:
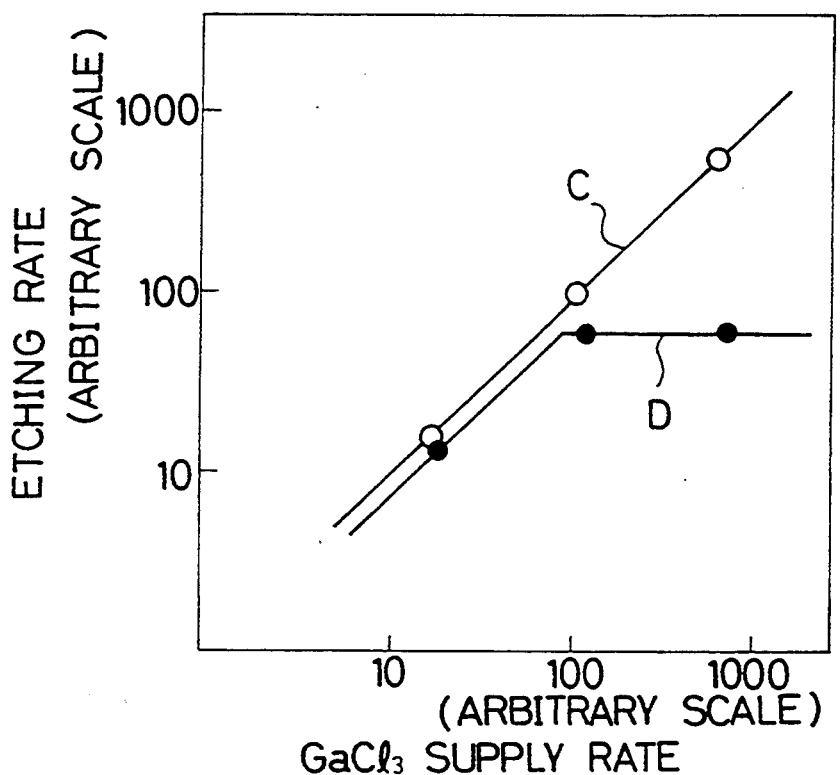

FIG. 9A shows the relation between the etching rate and the substrate temperature when the quantity of supply of GaCl$_3$ is taken as a parameter. The curve A is obtained when the quantity of supply of GaCl$_3$ is one-third the quantity supplied in the case of the curve B. FIG. 9B shows the relation between the etching rate and the GaCl$_3$ supply quantity when the substrate temperature is taken as a parameter. The curve C is obtained when the substrate temperature is 350° C., while the curve D is obtained when the substrate temperature is 250° C.

It will be seen from these graphs that the etching rate is determined by the quantity of GaCl$_3$ supply while the substrate temperature is high, but when the substrate temperature is reduced, the etching rate is substantially independent of the quantity of $GaCl_3$ supply and depends only on the substrate temperature. Thus, an optimum etching rate can be set by suitably selecting the substrate temperature and the quantity of $GaCl_3$ supply.

Figure 10:
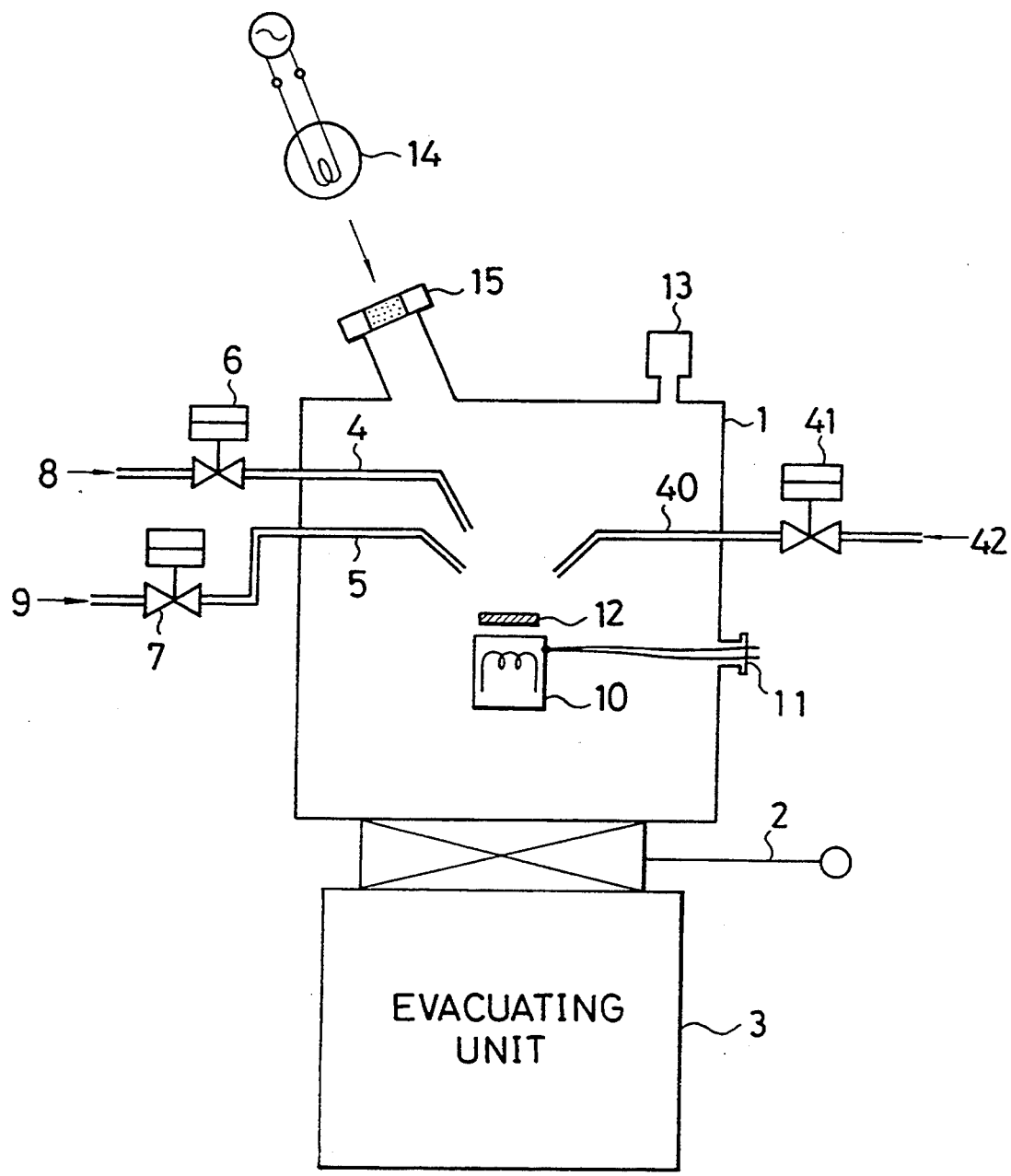
FIG. 10 is a schematic view showing yet another embodiment of the semiconductor crystal growth apparatus according to the invention.

FIG. 10 shows a further embodiment of the invention. This apparatus which is a modification of that shown in FIG. 8 is provided with a mechanism for irradiating the substrate 12, i.e., a radiation source 14 and an optical window 15 for directing radiation when vapor phase etching is carried out.

By the irradiation, it was possible to reduce the etching temperature by 100 degrees or more. The irradiation may be made continuously or intermittently during the process of vapor phase etching. In this case, not only the substrate 12 is irradiated, but also the etching gas itself may be radiated by forming the nozzle from a transparent material. By so doing, the etching gas can be activated to promote the etching process. The radiation source is not limited to a lamp such as a high-pressure mercury lamp or a xenon lamp; i.e., it is possible to employ an excimer laser or a multiplied laser beam.

The activation of the etching gas may be caused not only by the irradiation noted above but also by applying a voltage to a high frequency coil or electrodes provided in the neighborhood of the nozzle 41.

While the above embodiments have referred principally to the (100) plane of GaAs used as the substrate for the crystal growth, the invention is applicable to other planes as well and is not restricted in any way by the impurity concentration of the substrate. Further, the invention is equally effectively applicable to II–VI group compounds, such as InP, AlP, GaP, etc., and also to IV group element semiconductors, such as, Si, Ge, etc. Further, the invention is applicable to mixed crystals, e.g., $Ga_{(1-x)}Al_xAs$, $Ga_{(1-x)}Al_xAs_{(1-y)}P_y$, etc. Further, the gaseous compound used for the etching is not limited to $GaCl_3$, and it may be HCl, HBr, $PCl_3$, $AsCl_3$, $Cl_2$, $SF_6$, $CCl_2F_2$, $CF_4$, $C_3F_8$, $CH_3Br$, etc. Further, it is apparent that a substrate pretreatment chamber may be disposed adjacent to the crystal growth chamber, and the substrate may be pretreated in the pretreatment chamber before it is moved under vacuum into the crystal growth chamber for crystal growth therein.

What is claimed is:

1. A method of growing a semiconductor crystal on a substrate through epitaxial growth of molecular layers, comprising the steps of:

heating a substrate within a crystal growth vessel enclosing said substrate;

introducing gases containing component elements of a crystal to be grown on said substrate in said vessel from outside sources via nozzles;

permitting and stopping the introducing of the gases on said substrate by operating valve means in open and closed positions, said valve means being arranged between said nozzles and said sources;

selectively cycling the opening and the closing of said valve means in accordance with a program having data indicative of a number of cycles of opening and closing of the valve means, a time period for introduction of each of the gases, and a time period for exhaustion of each of the gases between introductions of each of the gases, said data being selected based on attaining a desired thickness of the growth layer to be obtained as precise as a single molecular layer;

exhausting residuals of the gases by evacuating an interior of said vessel with an ultrahigh vacuum of $10^{-7}$ to $10^{-8}$ Pa even while said control means is selectively cycling the opening and closing of the valve means;

tracing and evaluating progress of the semiconductor crystal growth within the vessel, said step of tracing and evaluating including extending a mass analyzer into said vessel for capturing molecules liberated from said substrate;

absorbing an excess of the gas being introduced, the step of absorbing including employing a first shroud within said vessel, said first shroud having opening aligned with respective openings of said nozzles, employing a second shroud having a detection opening which is aligned with an end of said mass analyzer, arranging said first and second shrouds for absorbing the excess of the gas to allow said mass analyzer to capture only molecules liberated from said substrate; and cooling both of said first and second shrouds.

2. A method as in claim 1, further comprising:

irradiating said substrate with ultraviolet rays while said substrate is being heated, wherein the step of introducing gases takes place under pressure of $10^{-1}$ to $10^{-7}$ Pa.

3. A method as in claim 2, wherein the step of irradiating includes irradiating with a radiation source means that is external to said vessel, said vessel having a window between said radiation source means and where said substrate is within said vessel.

4. A method as in claim 1, wherein said substrate is arranged at an elevation within the vessel between that of said nozzles and that where the exhausting takes place.

5. A method as in claim 1, further comprising introducing an etchant gas within said vessel to treat a surface of said substrate with vapor phase etching from said etchant gas before growing the crystal.

6. A method as in claim 5, further comprising arranging a high frequency coil or electrodes in the neighborhood of at least part of said etchant gas introduction nozzle means.

7. A method as in claim 5, further comprising irradiating at least part of said etchant gas.

* * * * *